US005592364A

United States Patent [19]
Roane

[11] Patent Number: 5,592,364
[45] Date of Patent: Jan. 7, 1997

[54] HIGH DENSITY INTEGRATED CIRCUIT MODULE WITH COMPLEX ELECTRICAL INTERCONNECT RAILS

[75] Inventor: Jerry M. Roane, Austin, Tex.

[73] Assignee: Staktek Corporation, Austin, Tex.

[21] Appl. No.: 377,578

[22] Filed: Jan. 24, 1995

[51] Int. Cl.$^6$ ............................................. H05K 7/20
[52] U.S. Cl. ..................... 361/735; 257/686; 257/691; 361/813
[58] Field of Search ................................ 361/679, 729, 361/730, 733, 735, 744, 775, 790, 807, 809, 810, 813; 174/51, 52.4; 439/68–70, 94, 95; 257/666, 686, 696, 691–693, 786

[56] References Cited

U.S. PATENT DOCUMENTS

| | | | |
|---|---|---|---|
| 1,173,540 | 2/1916 | Seeley | 361/735 |
| 3,184,649 | 5/1965 | Singletary | 361/735 |
| 3,746,934 | 7/1973 | Stein | 317/101 |
| 4,103,318 | 7/1978 | Schwede | 361/388 |
| 4,149,218 | 4/1979 | Carrubba | 361/383 |
| 4,437,235 | 3/1984 | McIver | 29/840 |
| 4,521,828 | 6/1985 | Fanning | 361/386 |
| 4,525,921 | 7/1985 | Carson et al. | 29/577 |
| 4,763,188 | 8/1988 | Johnson | 357/74 |
| 4,862,249 | 8/1989 | Carlson | 357/80 |
| 4,878,106 | 10/1989 | Sachs | 357/72 |
| 4,884,237 | 11/1989 | Mueller et al. | 365/63 |
| 4,953,005 | 8/1990 | Carlson et al. | 357/80 |
| 4,953,060 | 8/1990 | Lauffer et al. | 361/388 |
| 4,956,694 | 9/1990 | Eide | 387/74 |
| 5,016,138 | 5/1991 | Woodman | 361/381 |
| 5,343,075 | 8/1994 | Nishino | 257/686 |
| 5,420,751 | 5/1995 | Burns | 361/707 |
| 5,424,920 | 6/1995 | Miyake | 361/735 |

OTHER PUBLICATIONS

Information allegedly written by Emory Garth regarding "Memory Stacks," Applicant received a facsimile from Emory Garth on Jan. 26, 1993, Applicant does not know when the information was written or its validity. Labeled A. Catalog of Dense-Pac Microsystems, Inc. describing two products: DPS512X16A3 Ceramic 512K X 16 CMOS SRAM Module and DPS512X16AA3 High Speed Ceramic 512K X 16 CMOS SRAM Module, pp. 865–870.

"High Density Memory Packaging Technology High Speed Imaging Applications," Dean Frew, Texas Instruments Inc., *SPIE vol. 1346 Ultrahigh-and High—Speed Photography, Photonics, and Velocimetry* '90, pp. 200–209.

"Vertically-Integrated Package," Abstract, Alvin Weinberg, W. Kinzy Jones, IEEE, pp. 436–443.

"3D Interconnection For Ultra-Dense Multichip Modules," Abstract, Christian VAL, IEEE, pp. 540–547.

*Primary Examiner*—Gerald P. Tolin
*Attorney, Agent, or Firm*—Fulbright & Jaworski L.L.P.

[57] ABSTRACT

The present invention includes a high density integrated circuit module which includes a plurality of stacked, individual integrated circuit devices wherein serpentine electrical interconnect rails connect electrical leads extending from the individual integrated circuit devices within the module.

9 Claims, 3 Drawing Sheets

HIGH DENSITY INTEGRATED CIRCUIT MODULE WITH COMPLEX ELECTRICAL INTERCONNECT RAILS

BACKGROUND OF THE INVENTION

1. Field of the Invention

This invention relates to a high-density, integrated circuit module, which includes a plurality of stacked individual integrated circuit devices including complex geometric or serpentine interconnect rails for selectively interconnecting leads of the stacked integrated circuit devices to each other and to external circuitry.

2. Discussion of the Related Technology

One method of achieving an ultra high density integrated circuit module, which includes stacked individual integrated circuit devices, is to use external electrical interconnect rails to interconnect electrical leads extending from the stacked individual integrated circuit devices within the module. This method and high density module is described in U.S. Pat. Nos. 5,279,029 and 5,367,766, which are assigned to the common assignee of the present invention and are incorporated by reference herein for all purposes.

In applications where the high density integrated circuit module includes dissimilar integrated circuit devices, e.g. memory devices, microprocessor, DMA device, etc., or where the lead-to-lead spacing of individual devices is not uniform, there is a need for a signal path that provides selectable electrical interconnections between the dissimilar integrated circuit devices which make up the module.

Although the prior art discloses a method and apparatus for electrically interconnecting the leads of stacked integrated circuit devices within a high density module, the electrical interconnect rails associated with these prior art devices are linear, which makes electrical interconnection with leads of every other device in the stack, or with every third or fourth device in the stack, more difficult. Leads from integrated circuit devices which are not to be electrically connected to the linear rails must be trimmed internally or externally so as to not contact the rail or, at the very least, bent away from the rails so that the solder connection between the rails and the leads is simply not made. This requires a more complex manufacturing process.

The need exists for a rail design which enables complex electrical interconnections with leads of selected integrated circuit devices within the high density module, without requiring leads to be trimmed, which simplifies the module manufacturing process.

SUMMARY OF INVENTION

The present invention provides a method and apparatus for selectively interconnecting leads of individual integrated circuit devices stacked within a high density integrated circuit module. The electrical interconnections are made by rails of the present invention which are of complex geometric or serpentine-shape so as to be readily adapted to selectively interconnect with alternating leads or alternating groups of leads within the high density integrated circuit module. The serpentine rails may be shaped to selectively connect only with every other pair of integrated circuit devices. Other serpentine rail configurations may be used, depending on the devices to be interconnected. It is a feature of the present invention that the complex rail assembly may be formed much like conventional lead frames used for internal die connections. That is, the rail assembly of the present invention may be formed out of copper sheet metal stock with shorting bars supporting individual conductors or rails until they are sheared in final assembly. This method is particularly advantageous in those more complex applications when the rails are narrow and closely spaced.

The serpentine configured rails weave around leads of integrated circuit devices within the module that are not to be connected to that particular rail. Because of this, manufacturing becomes simplified since integrated circuit leads that are not to be connected will not have to be trimmed or otherwise removed and accidental undesired solder connections between unselected leads and the rail will be reduced.

Thus, in a case where the high density integrated circuit module includes several SRAM devices, a DMA device, a microprocessor, and other assorted integrated circuit devices, a particular serpentine rail might be electrically connected only to address or data pins of selected integrated circuit devices within the module. For mass production of high density integrated circuit modules made up of dissimilar integrated circuit devices or where lead-to-lead spacing on individual devices is not uniform, the serpentine rail assembly associated with the desired electrical interconnects can also be mass produced which will reduce the cost and simplify the manufacturing process for making the desired selected electrical interconnections.

DETAILED DESCRIPTION OF THE PREFERRED EMBODIMENT

Figure 1:
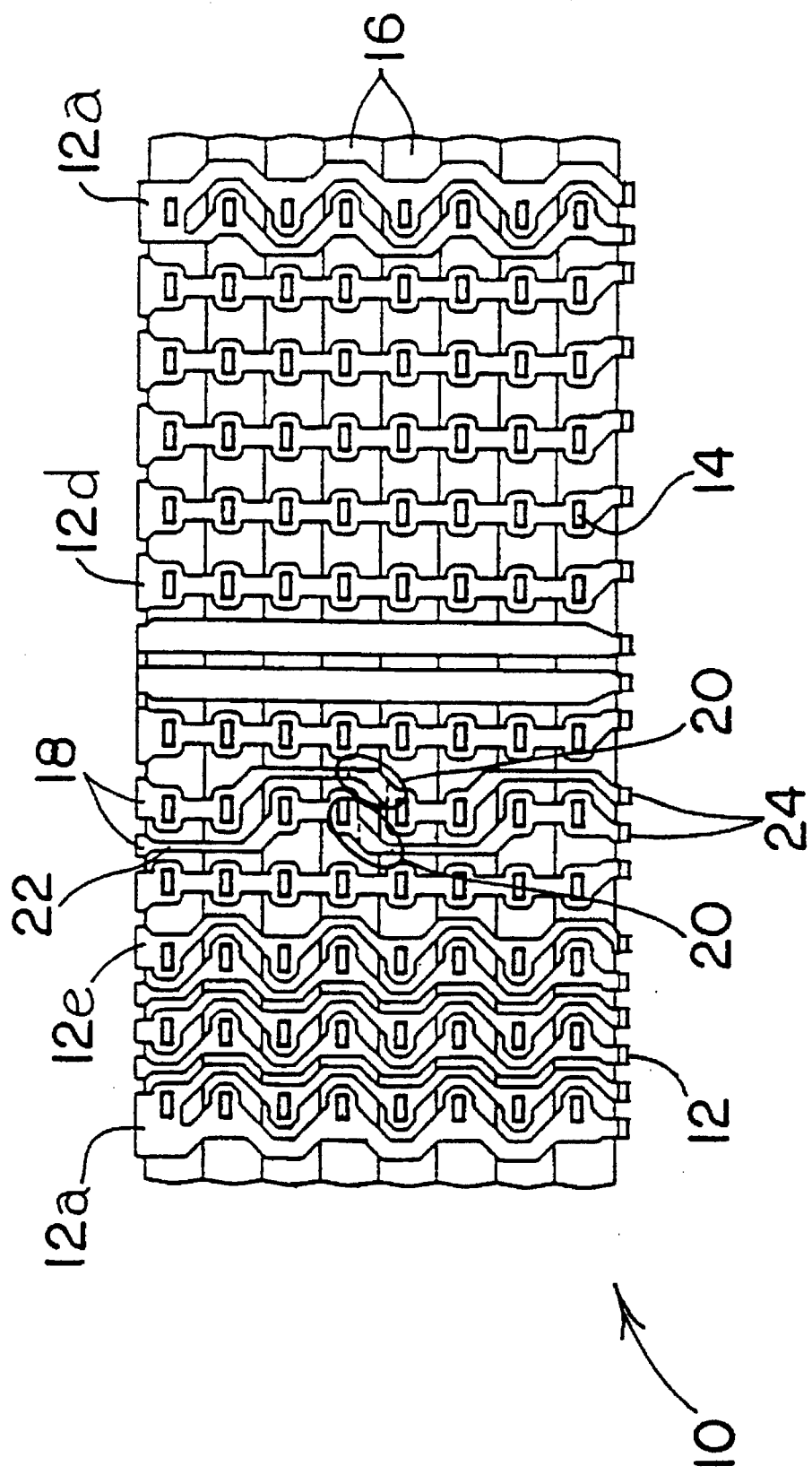
FIG. 1 is a side view of the high density integrated circuit module and serpentine electrical interconnect leads of the present invention.

FIG. 1 illustrates the serpentine interconnect rail assembly 12 and high density integrated circuit module 10 of the present invention. As can be seen, serpentine rails 12 are selectively connected to leads 14 of certain integrated circuit devices 16 within module 10. Partitioned rails 18 include partition portions indicated by hashed lines on partitioned rails 18 within circles 20 in FIG. 1. The hashed lines are perforations on these partition rails 18. Thus, by removing the portion of the partitioned rail 18 between the perforations, an upper portion 22 of each partition rail 18 will be separated from a lower portion 24 which will electrically isolate the upper and lower portions of partition rail 18 from each other.

High density integrated circuit module 10 includes multiple stacked integrated circuit devices 16, or level-one integrated circuit packages, or devices, wherein each integrated circuit device 16 within module 10 includes one or more integrated circuit die encapsulated within a casing (not shown). Electrical interconnect leads 14 (FIG. 3) extend through the casing of each integrated circuit device 16 within module 10.

As can be seen in FIG. 1, a particular rail 12d may be linear and interconnect with each lead 14 of each integrated circuit device 16 in a column configuration. Another rail 12e may otherwise be non-linear or serpentine in configuration and interconnect only with a lead 14 of every other integrated circuit device 16 within module 10, such as perforated rails 18 (FIG. 1). In some applications, adjacent rails 12a may be interconnected with each other. In yet other configurations, rails 12 in Fig. 1 interconnect with every other pair of leads from adjacent integrated circuit devices 16 within module 10. In other embodiments, rails 12 may interconnect with leads of every other group of triplets of integrated circuit devices 16 within module 10 (not shown). Interconnection with leads of every other group of four integrated circuit devices 16 within module 10, may also be made. Other patterns of selected interconnection may be utilized.

Figure 4A:
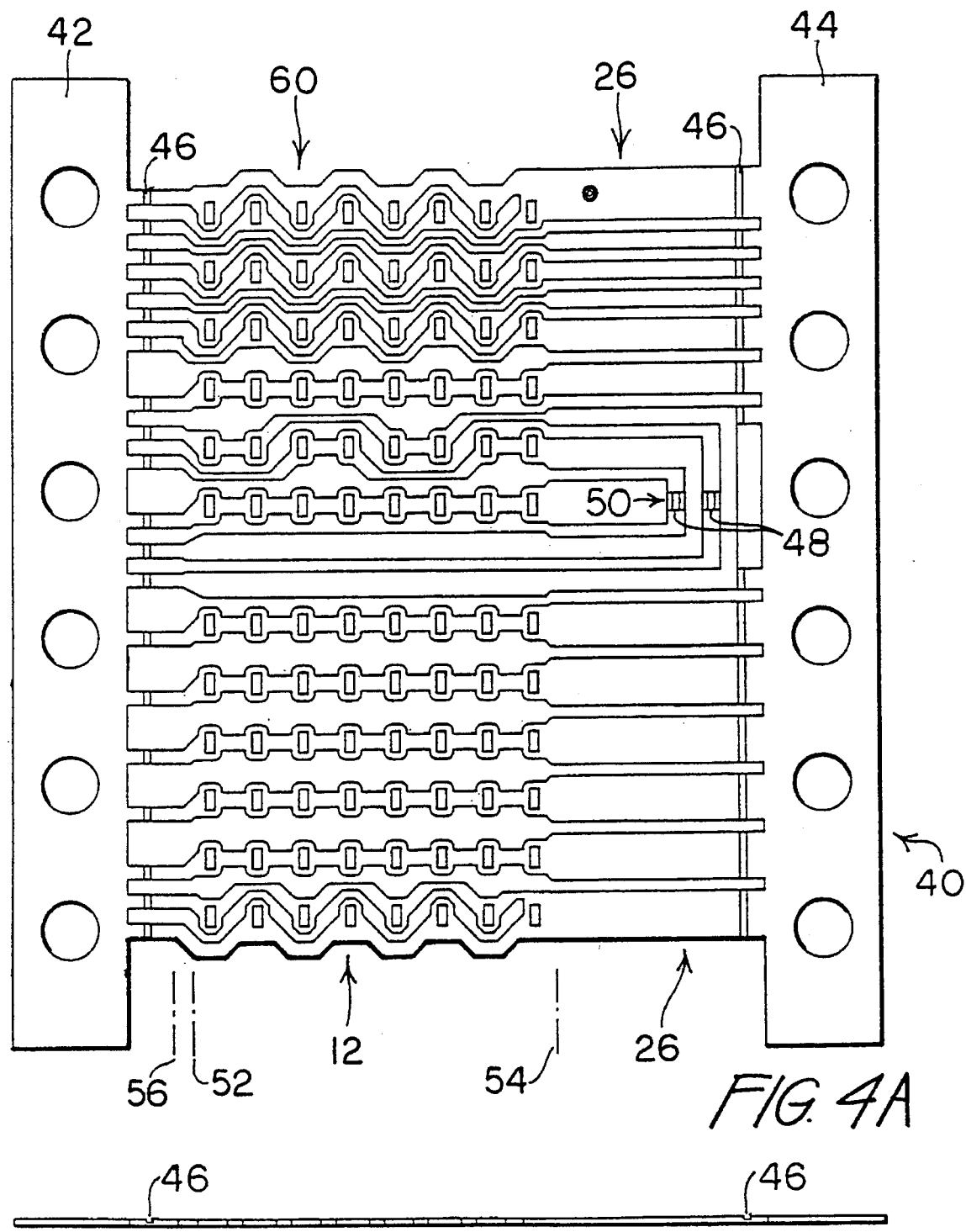
FIGS. 4A and 4B is a plan view of the preferred embodiment of a rail assembly according to the present invention, wherein upper and lower shorting bars are still intact.
Figure 4B:
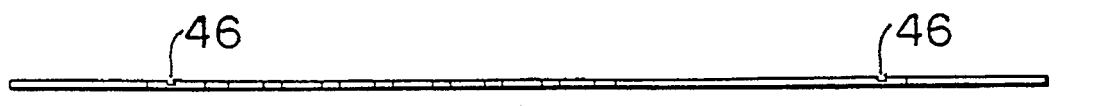

Referring now to FIGS. 4A and 4B, a rail assembly 40 includes lower shorting bar 42 and upper shorting bar 44 which hold rail assembly 40 together during the assembly process. Shorting bars 42 and 44 are removed by bending or cutting along weakened, half-thickness zones 46 once assembly 40 is formed and in place around module 10. Assembly 40 also includes optional break-out links 48 which have weakened, half-thickness areas 50 which facilitate optional disconnect between adjacent rails.

Still referring to FIGS. 4A and 4B, rail assembly 40 is etched or stamped as a planar assembly which is then formed or bent to wrap around one side of module 10. To achieve the requisite u-shape, assembly 40 is bent at points 52, 54 and 56 during the assembly process. Assembly 40, specifically upper portion 26, is adhered to the upper surface of the uppermost level one package in module 10. The preferred adhesive is one-inch Kapton tape with approximately 0.6 mils of thermoplastic adhesive on both sides. The preferred adhesive should be one which may be set by exposure to temperature of about 240° C.–260° C. for approximately three seconds. Alternatively; assembly 40 may be adhered to module 10 using suitable thermoset adhesives either free form or on Kapton tape.

Once assembly 40 is adhered to module 10, upper shorting bar 44 is removed. Assembly 40 is then formed or bent around module 10 manually or automatically so that the lead interconnect portions of rails 12 are aligned in parallel to leads 14, positioned to be soldered to selected lead 14.

After soldering, the lower portion 60 (FIGS. 4A and 4B) of assembly 40 is wrapped or bent to lie parallel to the lower surface of the module 10. Lower portion 60 is preferably not adhered to module 10 to allow for expansion. In some applications where rails 12 are thin, it may be desirable to provide a slotted lower stabilizer to receive and position the lower portion of rails 12. Such a configuration is shown in U.S. patent application Serial No., 08/380,543, entitled "High Density Integrated Circuit Module with Snap-on Rail Assemblies," by Carmen D. Burns, filed Jan. 30,1995, assigned to the common assignee hereof and incorporated by reference herein for all purposes.

A preferred method of manufacturing the high density integrated circuit module 10 including the electrical interconnect rail assembly 12 of the present invention is as follows:

1. Form a vertical stack of TSOP integrated circuit devices;
2. Mount a lead frame type rail assembly, which includes upper and lower shorting bars, to the upper major surface of the uppermost integrated circuit device within the module;
3. Remove the upper shorting bars from the upper rail assemblies where the rail assembly extends over and is mounted to the uppermost integrated circuit device in the module;
4. Align the rails with the selected electrical interconnect leads protruding from the integrated circuit devices in the module and insert the selected leads through the openings in the rails;
5. Solder the leads protruding through the rails to the rails; and
6. Remove the lower shorting bars from the bottom of the rail assemblies near the bottom most integrated circuit device in the module.

The preferred method of soldering the rails to the package is a gang soldering technique such as that described in U.S. Pat. No. 5,236,117, which is incorporated by reference herein for all purposes.

Figure 2:
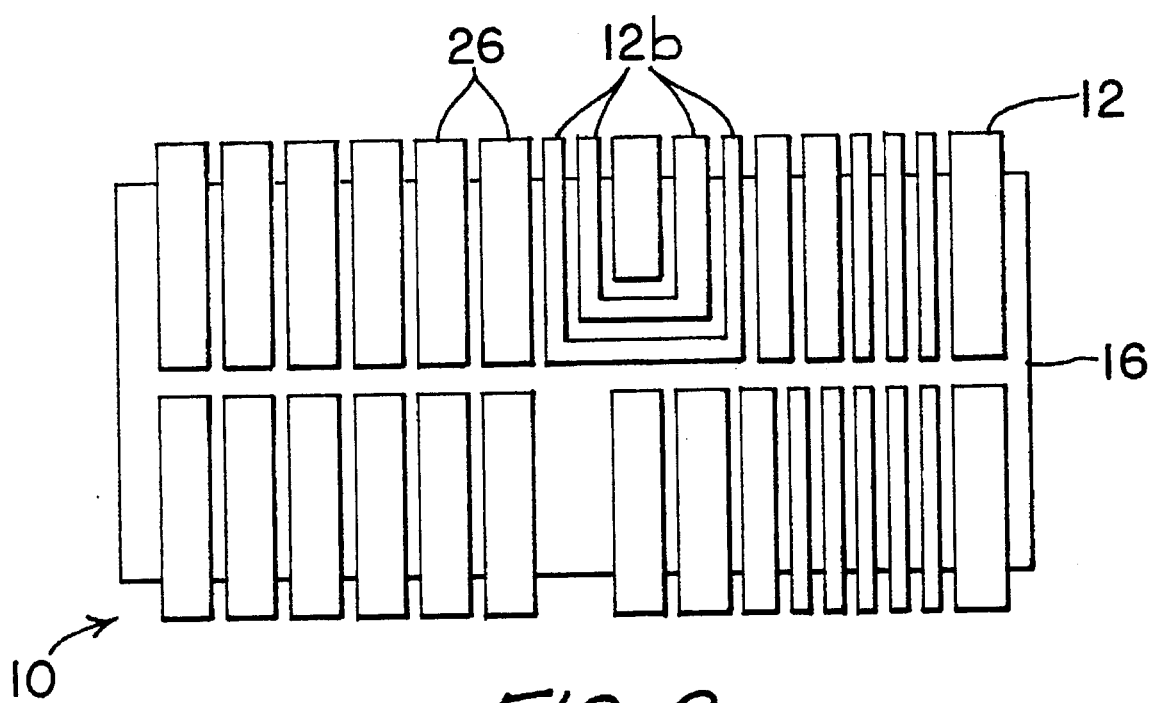
FIG. 2 is a top down view of the high density integrated circuit module showing the upper portion of the serpentine electrical interconnect rails of the present invention.

Referring to FIG. 2, a top-down view of the high density integrated circuit module 10 is depicted. As can be seen, rails 12 extend over the uppermost integrated circuit device 16 within module 10. Rails 12 include a upper rail portion 26 which overlays the upper major surface of the uppermost integrated circuit device 16 within module 10. The upper portion 26 of one or more rails 12 may be connected, as exemplified by rails 12b. Preferably, upper portion 26 of each rail 12 is glued, or otherwise laminated to the upper major surface of the uppermost integrated circuit device 16 within module 12 using high temperature adhesive or epoxy.

Figure 3:
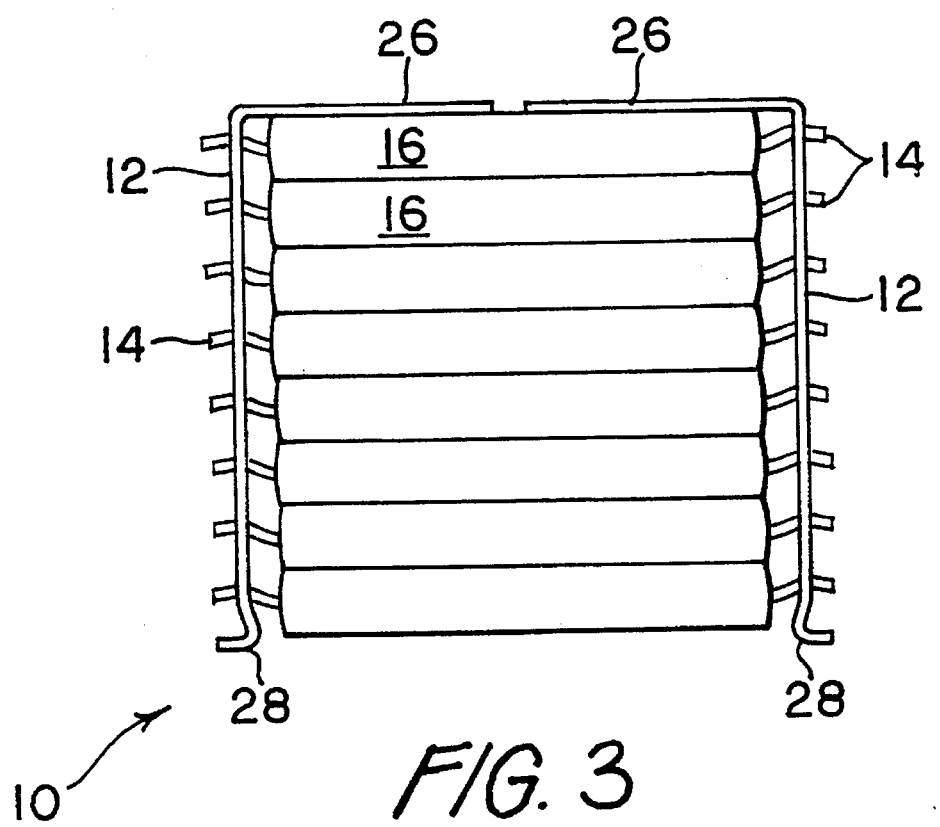
FIG. 3 is a profile view of the high density integrated circuit module including serpentine electrical interconnect rails and integrated circuit device leads, of the present invention.

FIG. 3 shows an end view of module 10 with electrical interconnect leads 14 protruding through rails 12. In the preferred embodiment, circuit board interconnection to rails 12 is provided by a circuit board mounting portion 28 of rails 12. Mounting portion 28 can be configured in J-lead, Gull-wing or any conventional interconnect format. Module 10 may be mounted to a printed circuit board (not shown) with printed circuit board mounting portion 28. Rails 12 would then be electrically connected to the printed circuit board by socketing or soldering printed circuit board connection portions 28 to circuit paths in the printed circuit board.

The foregoing disclosure and description of the invention are illustrative and explanatory of the preferred embodiments, and changes in the materials, individual components, circuit elements and connections may be made without departing from the spirit of the invention.

What is claimed is:

1. A high density integrated circuit module, comprising:
   a plurality of stacked level-one integrated circuit devices, each said level-one device comprising an integrated circuit die encapsulated in a casing, said level-one device including leads extending through said casing; and
   a rail assembly, comprising a plurality of rails which electrically and thermally interconnect with only selected leads from selected stacked level-one devices, wherein one or more of said rails are substantially flat in cross-section and are meandering in a non-linear connection path among selected not immediately adjacent leads from selected level-one devices.

2. The module of claim 1, wherein said one or more rails interconnect with leads from alternating stacked level-one devices.

3. The module of claim 1, wherein said one or more rails interconnect with said leads from two immediately adjacent stacked level-one devices.

4. The module of claim 1, wherein said one or more rails interconnect with said leads from three immediately adjacent stacked level-one devices.

5. The module of claim 1, wherein a plurality of said one or more rails are electrically connected together.

6. The module of claim 1, wherein said one or more rails interconnect with leads from alternating pairs of adjacent level-one devices.

7. The module of claim 1, wherein said one or more rails interconnect with leads from alternating triplets of adjacent level-one devices.

8. The module of claim 1, wherein said one or more rails interconnect with leads from alternating pairs of adjacent level-one devices and said rails are perforated at one or more locations on each said rail.

9. The module of claim 1, wherein one or more of said rails are perforated.

* * * * *